(12) United States Patent
Luger et al.

(10) Patent No.: US 12,176,827 B2
(45) Date of Patent: Dec. 24, 2024

(54) INVERTER WITH LEG CURRENT DETECTION

(71) Applicant: Fronius International GmbH, Pettenbach (AT)

(72) Inventors: Philipp Luger, Wels-Thalheim (AT); Friedrich Oberzaucher, Wels-Thalheim (AT)

(73) Assignee: Fronius International GmbH, Pettenbach (AT)

( * ) Notice: Subject to any disclaimer, the term of this patent is extended or adjusted under 35 U.S.C. 154(b) by 261 days.

(21) Appl. No.: 17/797,274

(22) PCT Filed: Feb. 1, 2021

(86) PCT No.: PCT/EP2021/052284
§ 371 (c)(1),
(2) Date: Aug. 3, 2022

(87) PCT Pub. No.: WO2021/156191
PCT Pub. Date: Aug. 12, 2021

(65) Prior Publication Data
US 2023/0050348 A1 Feb. 16, 2023

(30) Foreign Application Priority Data
Feb. 4, 2020 (EP) ..................... 20155366

(51) Int. Cl.
*H02M 7/539* (2006.01)
*G01R 19/25* (2006.01)
*H02M 1/00* (2006.01)
(52) U.S. Cl.
CPC ............ *H02M 7/539* (2013.01); *G01R 19/25* (2013.01); *H02M 1/0009* (2021.05)

(58) Field of Classification Search
CPC ...... H02M 7/539; H02M 1/0009; G01R 19/25
See application file for complete search history.

(56) References Cited

U.S. PATENT DOCUMENTS 6,304,472 B1 10/2001 Nagasu et al.
9,455,631 B2 * 9/2016 Feldtkeller ............ H02M 3/158
(Continued)

FOREIGN PATENT DOCUMENTS

WO 2008/138771 11/2008

OTHER PUBLICATIONS

Int'l Search Report (Form PCT/ISA 210) conducted in Int'l Appln. No. PCT/EP2021/052284 (Mar. 31, 2021).
(Continued)

*Primary Examiner* — Kyle J Moody
(74) *Attorney, Agent, or Firm* — GREENBLUM & BERNSTEIN, P.L.C.

(57) ABSTRACT

To allow reliable current measurement of the output current of the switching stage of an inverter, especially at switching frequencies of the semiconductor switches in the 100 kHz range, a voltage at the choke is measured and integrated over time to be representative for the leg current in the choke. The time integral is processed in a processing unit, whereas the processed time integral is used in an inverter controller for controlling the inverter. The voltage at the choke is analogously integrated over time by two serially connected integrator capacitors, whereas across each of the integrator capacitors a reset switch is provided, for alternately resetting the corresponding integrator capacitor.

13 Claims, 5 Drawing Sheets

(56) References Cited

U.S. PATENT DOCUMENTS

Figure 1:
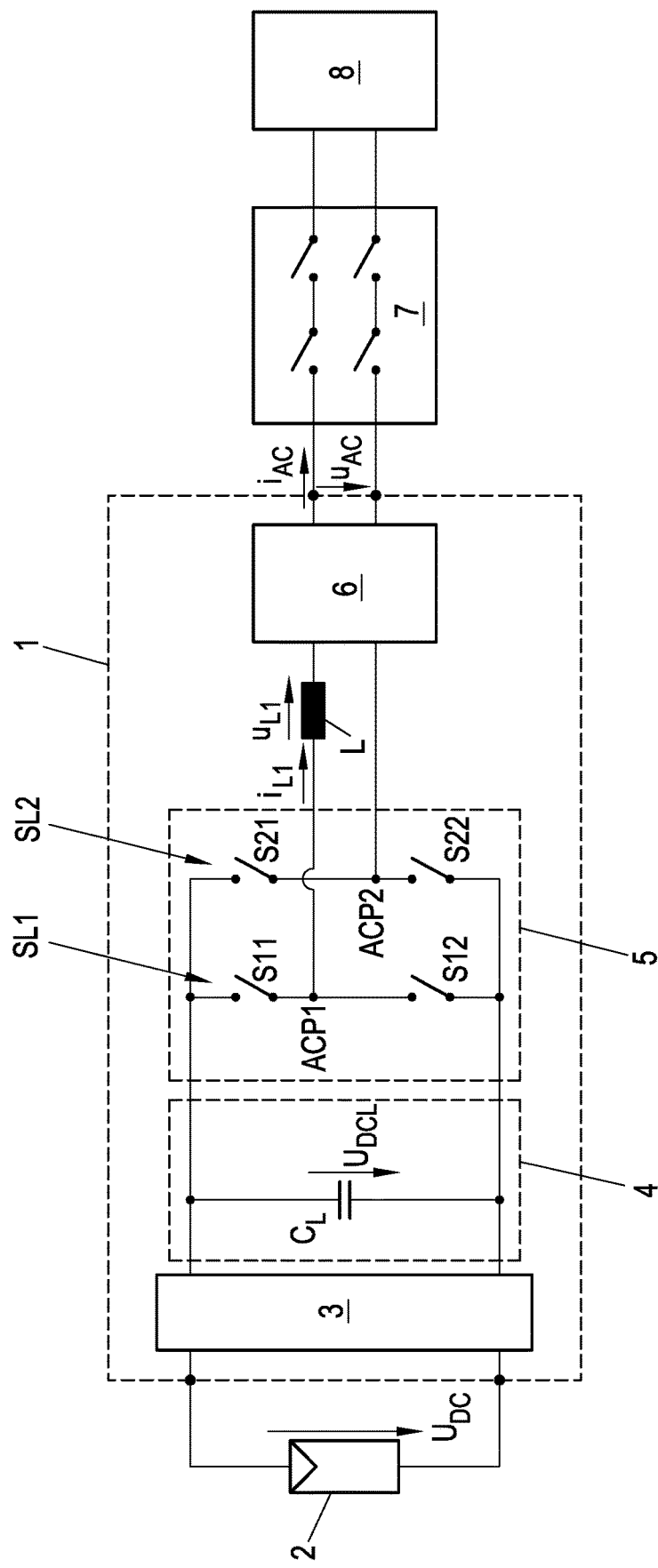
Figure 1:
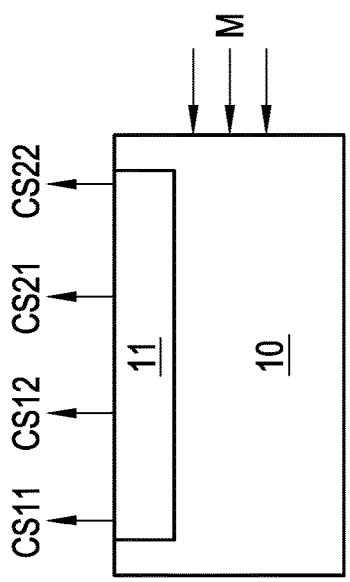

2015/0069990 A1    3/2015  Feldtkeller
2023/0116269 A1*   4/2023  Wieser .................. H02M 7/537
                                                       361/88

OTHER PUBLICATIONS

Int'l Written Opinion (Form PCT/ISA 237) conducted in Int'l Appln. No. PCT/EP2021/052284 (Mar. 31, 2021).
Int'l Preliminary Report on Patentability (Form PCT/IB/373) conducted in Int'l Appln. No. PCT/EP2021/052284 (Jul. 28, 2022).

* cited by examiner

INVERTER WITH LEG CURRENT DETECTION

The present invention pertains to an inverter having a switching stage with at least one switching leg, whereas switching leg comprises at least two serially connected semiconductor switches and an AC pole between the serially connected semiconductor switches, whereas the AC pole is serially connected to a choke, and whereas a current detection device is provided for detecting a leg current in the choke, wherein the current detection device uses a voltage measurement unit for measuring the voltage at the choke, and further uses an integrator for integrating the measured voltage at the choke over time, whereas the time integral of the voltage at the choke represents the current in the choke, and further comprises a processing unit for processing the time integral provided by the integrator, whereas the processed time integral is used in an inverter controller for controlling the inverter.

Inverter for converting DC voltage (direct current voltage) into AC voltage (alternating current voltage) are well known and are used in many different applications. One possible application is for supplying power into an AC grid (single phase or multiple phase) from a DC power source, e.g. a photovoltaic module, a battery, an AC/DC-converter, etc. Inverter, in general, use a switching stage with a number of semiconductor switches, such as IGBTs (insulated-gate bipolar transistor) or MOSFETs (metal-oxide-semiconductor field-effect transistor) for generating the desired AC output voltage(s) and current(s) of the inverter. The switching stage is usually supplied with DC current from a DC link. Switching of the semiconductor switches is controlled by a switching controller in order to generate the required output voltage(s) and/or output current(s). The switching controller often uses a PWM (Pulse Width Modulation) control strategy, although there are of course also further control strategies possible. Typical switching frequencies of the semiconductor switches in an inverter range from 20 to 200 kHz. Much higher switching frequencies are not possible with IGBT or MOSFET semiconductor switches due to inherent hardware limitations. In the last years new semiconductor switches emerged such like GaN (gallium nitride) switches. Such semiconductor switches allow for higher switching frequencies, i.e. in the range between 100 kHz to 400 kHz.

For operation of the inverter, e.g. for use by the switching controller for controlling the semiconductor switches or for overcurrent protection, certain voltages and currents of the inverter need to be measured, e.g. the output current(s) of the switching stage. The problem with existing current measurement devices is that certain known current measurement devices, e.g. like shunts, current sensors and the like, can only be used for a given maximum switching frequency as these devices are not quick enough to provide reliable current measurements at the resulting sampling times at the required switching frequencies. Other current measurement devices, e.g. like current transformers, could be used also for higher switching frequencies but would then generate high losses due to the high switching frequencies.

US 2015/0069990 A1 describes measuring a current through an inductor of a converter by analogously integrating a voltage across the inductor. The integrator is an operational amplifier circuit with an operational amplifier with an integrator capacitor in a feedback branch of the operational amplifier. The integrator uses several capacitors in the feedback branch that are connected in parallel and that can selectively be connected into the feedback branch for adjusting the integrator gain. An offset of the integration is controlled using a controllable current source that adds a variable current to the input of the integrating operational amplifier. Especially the required controllable current source makes this current measurement more complex.

U.S. Pat. No. 6,304,472 B1 describes a current measurement as alternative to a shunt or a current transformer. The current measurement is implemented as integrator integrating the voltage across the inductor. The integrator is an operational amplifier circuit with an operational amplifier with a single integrator capacitor in a feedback branch of the operational amplifier. In one embodiment a switch is used to reset the integrator capacitor. Switching the integrator capacitor causes an offset error in the current measurement, especially at high switching frequencies.

There is a need for a new simple and reliable current measurement device and method for measuring the output current of the switching stage, especially at switching frequencies of the semiconductor switches in the 100 kHz range, that can be used for controlling the inverter.

This object is achieved in that two integrator capacitors in series are arranged in the integrator, whereas across each of the integrator capacitors a reset switch is provided, for alternately resetting the corresponding integrator capacitor. Alternatively resetting the integrator capacitors reduces an offset in the analog integration and thus a drift of the integrator over time. This increases the reliability and accuracy of the integration and therefore of the current measurement and implementation of this circuit is simple. The integration of the measured voltage can be performed sufficiently quick so that even high frequency signals with frequencies in the 100 kHz range may be reliably processed. Apart from that the integration can be performed with low losses. As the time integral of the voltage measured at the choke corresponds to the leg current, the time integral may directly be processed in a processing unit for controlling the inverter. The processing unit may also be integrated in an inverter controller or may be the inverter controller itself.

The voltage measurement unit is advantageously implemented as differential amplifier or instrumentation amplifier using at least one operational amplifier and resistors. This allows for scaling down the measured voltage to voltage levels that are easier to process in the following stages.

In a possible implementation, the integrator is analogously implemented as serial RC circuit using at least one integrator capacitor serially connected to an integrator resistor or as operational amplifier circuit using at least one operational amplifier with at least one integrator capacitor in a feedback branch connecting an output port of the operational amplifier to an input port of the operational amplifier OP.

In an especially advantageous implementation, the reset switches are implemented as switchover switch, preferably as Make-Before-Break switch, as this allows for a further reduction in the offset. Resetting the capacitor or the capacitors is also advantageous for possible digital integration.

Resetting the at least one integrator capacitor or the serially connected integrator capacitors is preferably synchronized with zero crossings of the leg current.

The present invention is described in greater detail below with reference to the FIGS. 1 through 11, which show exemplary, schematic and non-limiting advantageous embodiments of the invention. In the drawings FIG. 1 shows a typical implementation of an inverter, FIG. 2 a leg voltage and a leg current at an AC pole of a switching leg, FIG. 3 an output current of the inverter as a result of the leg current, FIG. 4 an inverter with an inventive current detection device, FIG. 5 the time integral of the voltage at the choke, FIG. 6 the voltage measurement unit implemented as differential amplifier, FIG. 7 an analog implementation of the integrator using operational amplifier and one capacitor in the feedback branch with reset switch, FIG. 8 an analog implementation of the integrator using operational amplifier and with two serially connected capacitors in the feedback branch with reset switch, FIG. 9 an comparator circuit for detecting over currents, FIG. 10 digitization of the time integral and FIG. 11 digital integration of the measured voltage at the choke.

An inverter 1 is connected at the input to a DC source 2, e.g. a PV module (photovoltaic module) or a battery energy storage, and at the output to an electric load 8, e.g. an electric grid. The inverter 1 converts the DC input voltage $U_{DC}$ into an AC output voltage $u_{AC}$ and output current $i_{AC}$. The inverter 1 may also be implemented bidirectional, e.g. for supplying electric energy from an electric grid to a battery energy storage (in this case input and output of the inverter 1 would be switched). The inverter 1 usually comprises a switching stage 5 that is connected to a DC link 4 at the input stage of the inverter 1. At the input side of the inverter 1 there may optionally be arranged a DC filter 3, e.g. an EMC (electromagnetic compatibility) filter. At the output side of the inverter 1 there may optionally be arranged an AC filter 6, e.g. for smoothing the output voltage $u_{AC}$ and output current $i_{AC}$. The AC filter 6 may comprise a differential-mode filter (usually in form of capacitors connected between the phases) and/or an EMC filter (usually in form of capacitors connected between the phases and inductors in series to the phases). Between the inverter 1 and the load 8, there may optionally be arranged an AC relay 7 which allows for disconnecting the inverter 1 from the electric load 8. The AC relay 7, if present, may also be integrated in the inverter 1.

There are many different implementations of inverter 1 known. Inverter may differ in the number of phases they provide, e.g. a three-phase inverter for providing electric energy to a three-phase electric grid. Inverter 1 may also differ in the implementation of the switching stage 5.

A switching stage 5 comprises at least one switching leg SLn (n≥1), e.g. SL1, SL2 as in FIG. 1, connected in parallel to the DC link voltage $U_{DL}$ of the DC link 4. In a switching leg SLn at least two semiconductor switches Snm (m≥2) (at least one high-side and at least one low-side switch) are connected in series, e.g. switches S11, S12, S21, S22 as in FIG. 1. Between the high-side and low-side semiconductor switches Snm of a switching leg SLn an AC poles ACPn, e.g. ACP1, ACP2 as in FIG. 1, is formed at which the AC leg current $i_{Ln}$ and voltage $u_{Ln}$, e.g. $i_{L1}$ and $u_{L1}$ as in FIG. 1, of the switching leg SLn are provided. With one high-side and one low-side semiconductor switch Snm the AC leg voltage $u_{Ln}$ can have two voltage levels. There are also known switching stages 5 with more than one high-side and low-side semiconductor switches Snm which allow for more than two voltage levels of the AC leg voltage $u_{Ln}$ at the AC pole ACPn (so called multi-level inverter).

The inverter 1 may also have multiple switching legs SLn for providing multiple phases of the AC output voltage $u_{AC}$ (multi-phase inverter), e.g. three for providing a three-phase output voltage $u_{AC}$, or may also have several cascaded switching stages 5. The AC poles ACPn of several switching legs SLn of the switching stage 5 may also be connected to together form a phase of the output voltage $u_{AC}$. In this case the leg voltages $u_{Ln}$ of the connected switching legs SLn may also be phase shifted (interleaved inverter).

The actual implementation of the switching stage 5 is however not relevant for the invention.

The AC leg currents $i_{Ln}$ and voltages $u_{Ln}$ provided at the AC poles ACPn of the switching legs SLn are usually filtered by serially connected chokes L (inductors) in order to remove high frequency components of the AC waveforms. There is usually at least one choke L per phase of the output voltage $u_{AC}$.

The DC link 4 comprises at least one DC link capacitor $C_L$ that is connected in parallel to the input voltage $U_{DC}$ (optionally after filtering in the DC filter 3). The DC link voltage $U_{DCL}$ is provided at the Dc link 4. It is also known to use more link capacitors $C_L$ in series in the DC link 4. In such an implementation it would be possible to connect the pole between two capacitors $C_L$ in the DC link 4 with the neutral line at the output of the inverter 1 or with a star point of an AC output filter 6 (in case of e.g. three phases).

An inverter controller 10 is used for operating the inverter 1. Different measurement signals M, e.g. measured voltages and/or currents, of the inverter 1 may be used to that end, e.g. the DC link voltage $U_{DCL}$, the DC input voltage $U_{DC}$, the output voltage $u_{AC}$, the output current $i_{AC}$ or leg currents $i_{Ln}$. A leg current $i_{Ln}$ of a switching leg SLn may for example be used for overcurrent protection and regulation of the semiconductor switches Snm of this switching leg SLn. Voltage and current sensors used for measuring the required quantities are well known.

In the inverter controller 10 a switching controller 11 is implemented that generates the control signals CSnm, e.g. CS11, CS12, CS21, CS22 as in FIG. 1, for switching the semiconductor switches Snm in the switching stage 5 in order to generate the required output voltage $u_{AC}$ and/or output current $i_{AC}$ of the inverter 1. The control signals CSnm are usually provided to well-known gate driver (not shown for the sake of simplicity) for each semiconductor switch Snm that effectuate the switching of the semiconductor switches Snm. The gate drivers could also be integrated in the switching controller 11.

The inverter controller 10 can be implemented on a microprocessor-based hardware, like a computer, microcontroller, digital signal processor, programmable logic controller (PLC), etc, that is programmed with control software for operating the inverter 1. Also, implementations with application-specific integrated circuits (ASIC) or Field-programmable gate array (FPGA), or the like, are possible. The control software is stored in a memory of the inverter controller 10. The switching controller 11 and other functionalities of the inverter controller 10 can be implemented as software that is run on the inverter controller 10. The inverter controller 10 and the switching controller 11 could also be implemented as separate hardware. In this case the switching controller 11 could also be microprocessor-based hardware, like a microcontroller, a computer, digital signal processor, programmable logic controller (PLC) etc., or an application-specific integrated circuit (ASIC) or Field-programmable gate array (FPGA), or the like. The inverter controller 10 and/or the switching controller 11 could, however, also be implemented as analog circuits.

By way of example only, FIG. 1 shows a typical design of an inverter 1, in this case a single-phase inverter. In this example, the inverter 1 is supplied with DC power from a DC power source 2 and provides electric energy to an electric load 8 via an AC relay 7. At the input of the inverter 1 there is arranged a DC filter 3. The DC input voltage $U_{DC}$ after filtering in the DC filter 3 is supplied to a DC link 4 with at least one capacitor $C_L$ in parallel to the DC input voltage $U_{DC}$ provided by the DC power source 2. The DC link 4 is followed by a switching stage 5 having a number of semiconductor switches S11, S12, S21, S22. In the example of FIG. 1 the switching stage 5 has two switching legs SL1, SL2, whereas each switching leg SL1, SL2 is connected in parallel to the DC link 4, i.e. in parallel to the DC link voltage $U_{DCL}$. In each switching leg SL1, SL2 a high-side semiconductor switch S11, S21 and a low-side semiconductor switch S12, S22 are connected in series. Between the semiconductor switches S11, S21 and S12, S22 of a switching leg SL1, SL2 AC poles ACP1, ACP2 are formed. At one AC pole ACP1 the AC leg current $i_{L1}$ is provided. The other AC pole ACP2 serves as return path for the leg current. For a single-phase inverter 1, the second switching leg SL2 could of course also be omitted in well-known manner. With one semiconductor switch S11, S12 above and below the AC pole ACP, the AC waveforms at the AC pole ACP1 can have two voltage levels. A choke L is serially connected to the AC pole ACP1 of the switching leg SL1. There could also be provided an additional second choke L in the return path serially connected to the second AC pole ACP2 of the second switching leg SL2.

Figure 2:
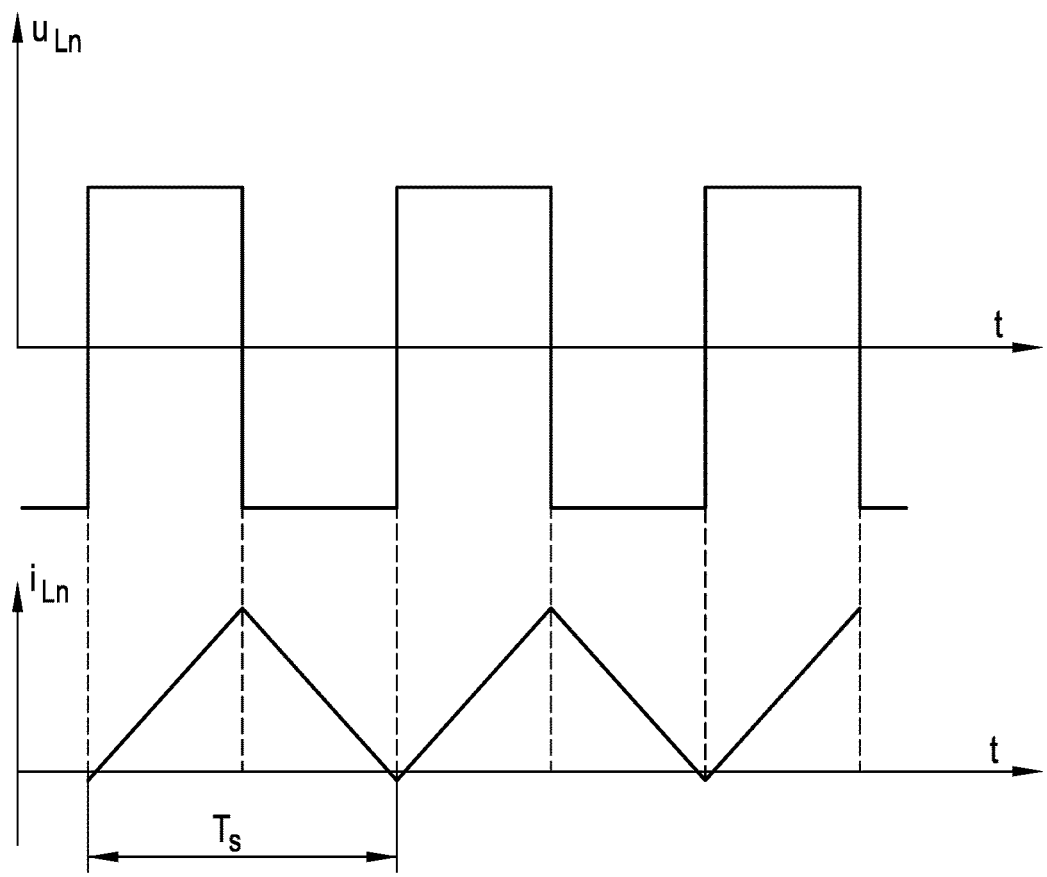
Figure 3:
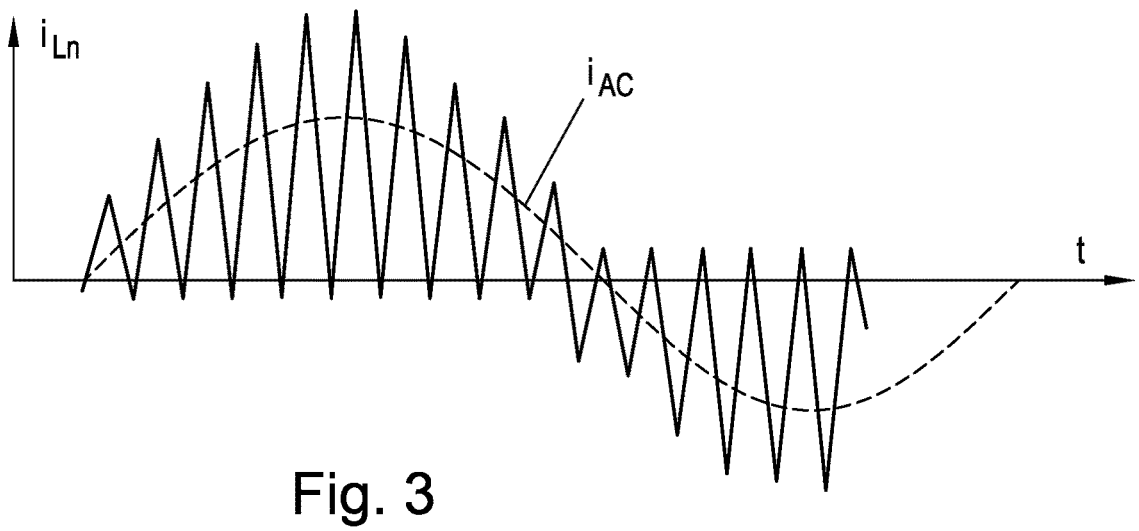

Because of the switching of the semiconductor switches Snm AC leg voltage $u_{Ln}$ with rising and falling edges, e.g. square wave or step wave (e.g. in the case of an multi-level inverter) waveforms, are generated at the AC poles ACPn of the switching legs SLn of the switching stage 5 as exemplarily shown in FIG. 2 above. Due to the choke L, also leg currents $i_{Ln}$ with rising and falling edges, e.g. like triangle waveforms, are generated as exemplarily shown in FIG. 2 below. The frequency of the AC leg voltages and currents of the switching legs SLn correspond to the switching frequency $f_S$ ($=1/T_S$) of the semiconductor switches Snm. The semiconductor switches Snm are switched in such a way, for example by using PWM, that the desired output voltage $u_{AC}$ or current $i_{AC}$, for example a 50 Hz sinus, are generated, as shown in FIG. 3. This means that the output current $i_{AC}$ of a phase the inverter 1, for example, is synthesized by a number of pulses of the corresponding leg current(s) $i_{Ln}$ of a switching leg SLn. In the example of FIGS. 2 and 3, a zero-voltage switching strategy is employed which causes zero crossings of the leg current $i_{Ln}$ in every switching period $T_S$ (as indicated in FIGS. 2 and 3).

The present invention aims at measuring a leg current $i_{Ln}$ of a switching leg SLn of a switching stage 5 of an inverter 1 that flows through a choke L connected in series to the AC pole ACPn of this switching leg SLn. The inventive current measurement allows for reliable and low-loss measurements even of high frequency currents (with frequencies in the range of 100 kHz). With the inventive current measurement also the peak measurements, for example for over current protection, are possible at such high frequencies.

Figure 4:
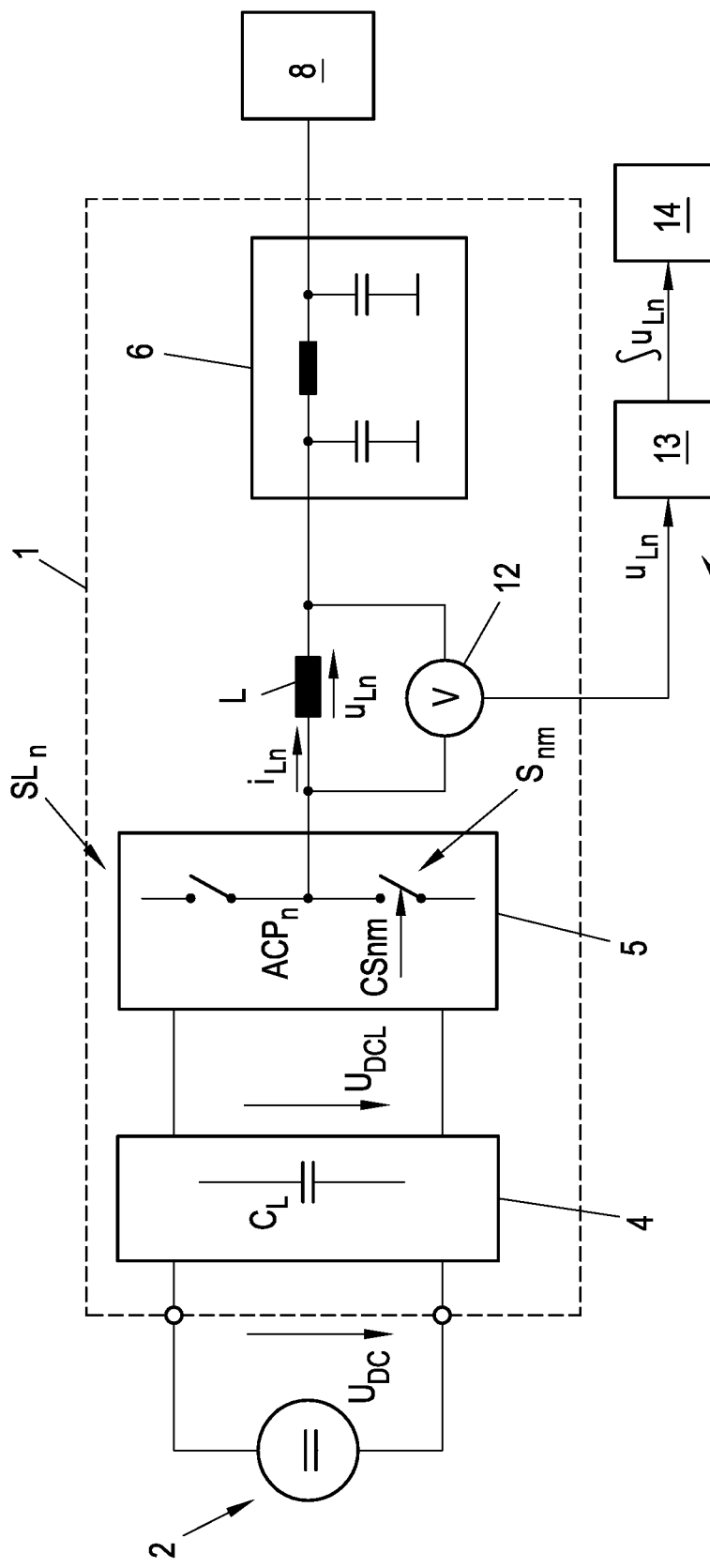

With reference to FIG. 4, an inventive current detection device 9 for measuring AC leg current $i_{Ln}$ provided at an AC pole ACPn of a switching leg SLn of a switching stage 5 of an inverter 1 and flowing through a choke L is described. The switching leg SLn has at least two semiconductor switches Snm, i.e. at least one high-side and least one low side switch. Shown in FIG. 4 is only one switching leg SLn, whereas the current measurement could of course be applied to further switching legs SLn of an inverter 1. As already mentioned above, a DC filter 3 and an AC filter 6 (a possible implementation is exemplarily shown) are optional.

The current detection device 9 comprises of a voltage measurement unit 12, e.g. a voltage sensor, a differential amplifier and the like, that measures the leg voltage $u_{Ln}$ (as shown in FIG. 2) across the choke L of the switching leg SLn. The current detection device 9 further comprises an integrator 13 that forms the integral $\int u_{Ln}$ over time t of the measured voltage $u_{Ln}$ at the choke L. The time integral $\int u_{Ln}$ is supplied to a processing unit 14 for processing.

Figure 5:
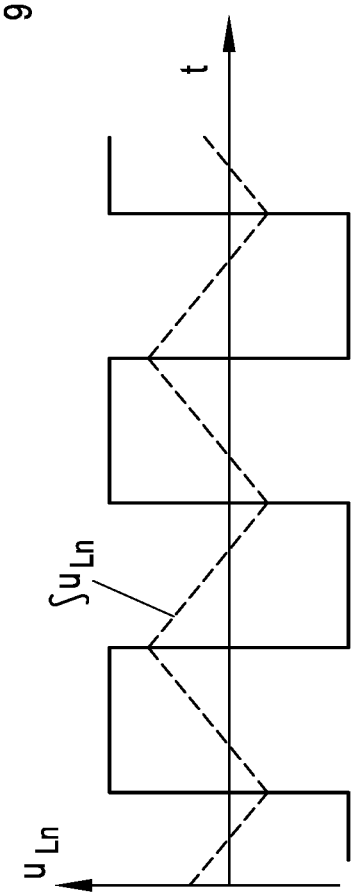

The time integral $\int u_{Ln}$ of the pulse shaped leg voltage $u_{Ln}$ at the choke L is a triangle shaped signal (FIG. 5). Hence, the shape of the time integral $\int u_{Ln}$ corresponds to the shape of the leg current $i_{Ln}$ (as shown in FIG. 2) that flows in the choke L. The time integral $\int u_{Ln}$ is therefore representative for the leg current $i_{Ln}$. This means that by integrating the voltage $u_{Ln}$ at the choke L over time t a measurement can be obtained that corresponds to the leg current $i_{Ln}$ in the choke L. The difference between the leg current $i_{Ln}$ and the time integral $\int u_{Ln}$ is a proportionality factor P that depends on the implementation of the voltage measurement unit 12 and the integrator 13, i.e. $i_{Ln}=P\cdot\int u_{Ln}$, and can be regarded as being known. Therefore, the time integral $\int u_{Ln}$ corresponds to the leg current $i_{Ln}$. The time integral $\int u_{Ln}$ can be evaluated and used in different ways in the processing unit 14 as will be described below. The processing unit 14 may apply the known proportionality factor P in order to obtain current measurements of the leg current $i_{Ln}$ from the time integral $\int u_{Ln}$.

Figure 6:
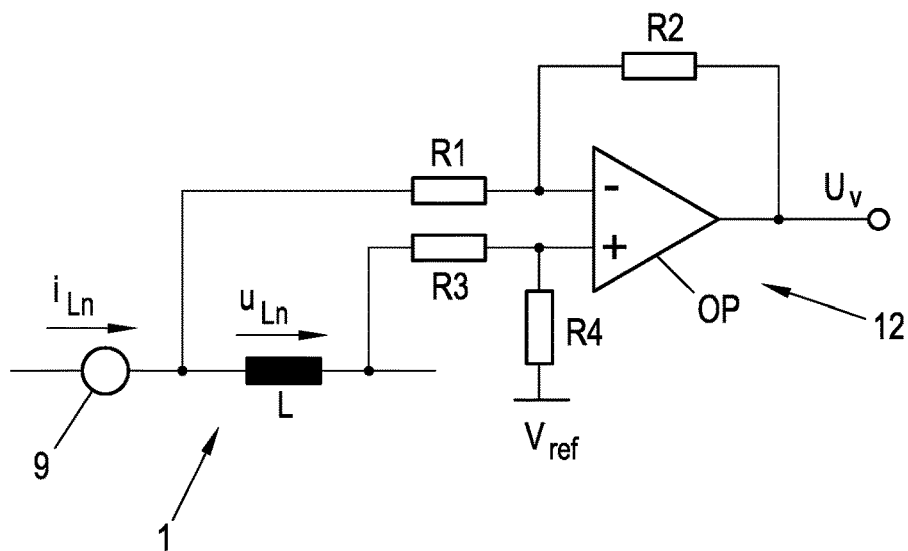

The voltage measurement unit 12 may be implemented as well-known differential amplifier (as shown in FIG. 6) or instrumentation amplifier using operational amplifier OP with the voltage $u_{Ln}$ across the choke L as input, for example. The voltage measurement unit 12 is in this case an analog circuit. The output of the voltage measurement unit 12 is a voltage $u_V$ that is representative for the measured leg voltage $u_{Ln}$ at the choke L. For a differential amplifier, the output voltage $u_V$ is a known function $f_D$ of the resistors of the circuit and the input $u_{Ln}$ to the differential amplifier, i.e. $u_V=f_D$ (H R1, R2, R3, R4). The same applies to an instrumentation amplifier. $V_{Ref}$ in FIG. 6 is a provided and known reference voltage. By using a differential or instrumentation amplifier, the high voltage $u_{Ln}$ at the choke L may be scaled down (dependent on the resistors used) to a lower voltage, for example to a voltage range between zero and five volts, that can be easier processed in the following stages. The output voltage $u_V$ auf the differential or instrumentation amplifier represents a measurement of the leg voltage $u_{Ln}$.

Figure 7:
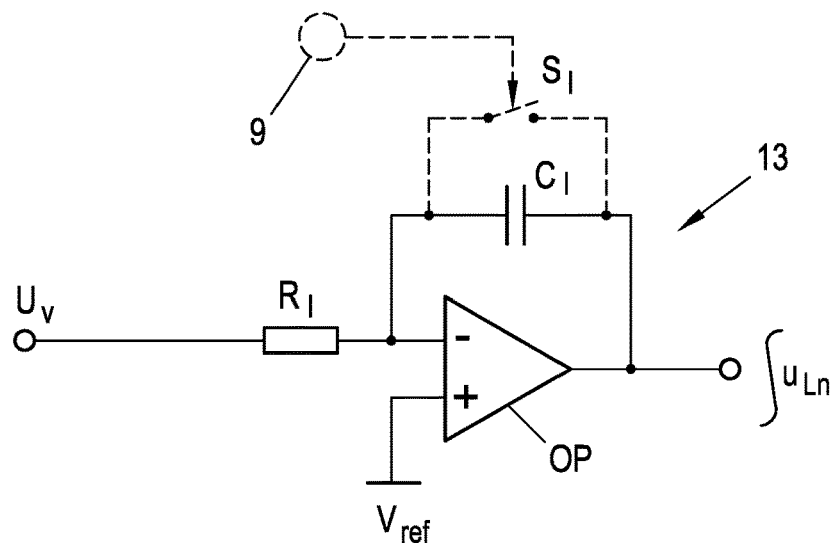

The integrator 13 could also be implemented as analog circuit in well-known manner with an operational amplifier OP as shown in FIG. 7. Typically, the integrator 13 has a capacitor $C_I$ in the feedback branch connecting the output port of the operational amplifier OP to an input port of the operational amplifier OP. The output of the integrator 13 is a known function $f_I$ of the input voltage $u_V$, the resistor $R_I$, the capacitor $C_I$ in the feedback branch and the time $\Delta t$ between two measurements, i.e. time integral $\int u_{Ln}=f_I(u_V, R, C, \Delta t)$. To avoid a drift of the integrator 13 over time, and hence an increasing offset in the time integral $\int u_{Ln}$, the capacitor $C_I$ can be reset at given times. The reset could be done by means of a reset switch $S_I$ connecting the two poles of the capacitor $C_I$ (as indicated with dashed lines in FIG. 7). The reset times could be synchronized with zero crossings of the leg current $i_{Ln}$ flowing in choke L. For that a zero-crossing detector 9 (FIG. 6), e.g. implemented as comparator circuit, could be used for detecting zero crossings of the leg current $i_{Ln}$.

As closing the switch $S_I$ for discharging the capacitor $C_I$ and opening the reset switch $S_I$ for recharging the capacitor $C_I$ takes some time, a certain offset error remains despite the reset, especially at higher frequencies. Hence, to improve the reset, two capacitors $C_{I1}, C_{I2}$ are used in accordance with the invention that are alternately reset, as shown in FIG. 8.

Figure 8:
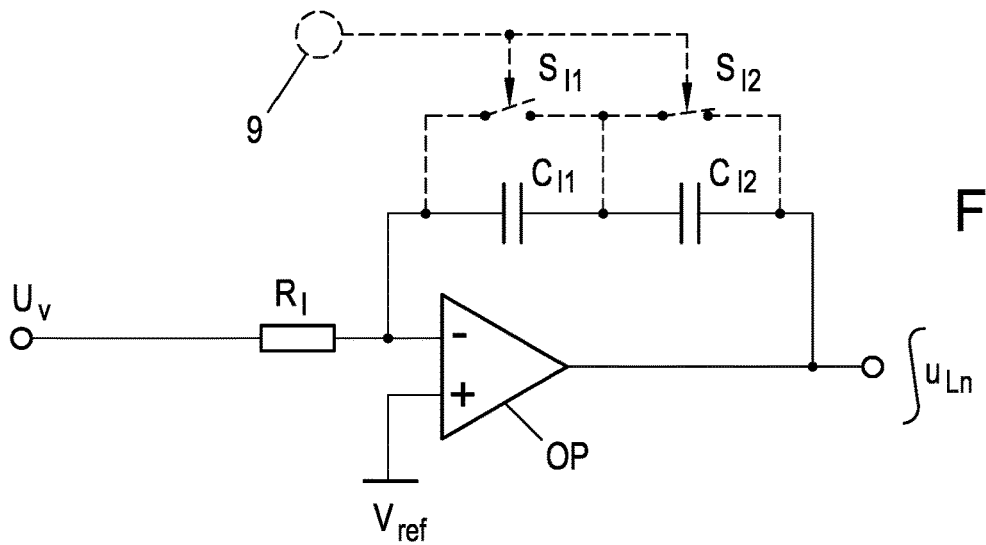

In the embodiment of FIG. 8 one capacitor $C_{I1}$ is charged at positive voltages $u_V$ (rising edge of $\int u_{Ln}$) and the other capacitor $C_{I2}$ is charged at negative voltages $u_V$ (falling edge of $\int u_{Ln}$). One of the capacitors $C_{I1}, C_{I2}$ is reset (short circuited by the corresponding switch $S_{I1}, S_{I2}$) and the other is charged. At every zero crossing of the leg current $i_{Ln}$ resetting and charging of the capacitors $C_{I1}, C_{I2}$ is switched over. By using two capacitors $C_{I1}, C_{I2}$ and two switches $S_{I1}, S_{I2}$ the offset introduced by the reset can be reduced.

The two switches $S_{I1}, S_{I2}$ could be implemented using a switchover switch, e.g. a single pole, double throw switch. In such a switch always one of the two output contacts is connected to the input contact and by switching the output contact that is connected to the input contact changes. In an advantageous embodiment a Make-Before-Break switch is used as switchover switch. In a Make-Before-Break switch the new connection is made before the previous connection is broken, so that the input contact is momentarily connected to both output contacts. By that it is avoided that one of the capacitors $C_{I1}, C_{I2}$ charges the other capacitor $C_{I1}, C_{I2}$ at switching which would occur when both switches $S_{I1}, S_{I2}$ were simultaneously open (which would be the case when using a Break-Before-Make switch).

The integrator 13 could, however, also be implemented as a well-known simple RC circuit with an integrator resistor $R_I$ connected in series to two serially connected integrator capacitors $C_I$ (as shown in FIG. 8) that are alternatively reset by two reset switches $S_I$ (as in FIG. 8). The voltage across the capacitor $C_I$ corresponds to the time integral $\int u_{Ln}$ of the input voltage $u_V$ of the RC circuit. Also, in this case use of a Make-Before-Break switch would be advantageous.

Figure 11:
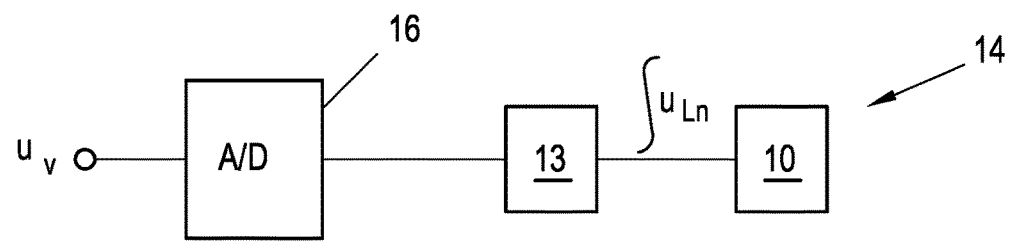

In an alternative embodiment (not in accordance with the invention), the integrator 13 could be implemented digitally, as shown in FIG. 11. For that the input voltage $u_V$ measured with the voltage measurement unit 12 is provided to an analog-to-digital converter 16 (A/D converter) for digitizing the input voltage $u_V$. The digitized input voltage $u_V$ is provided to the digital integrator 13, e.g. software that is run on a separate piece of hardware or on the hardware of the controller 10.

The time integral $\int u_{Ln}$ which represents a measurement of the leg current $i_{Ln}$ can then be processed in the processing unit 14, in the embodiment shown in the controller 10.

The processing unit 14 may be used for overcurrent protection or for current measurement, for example.

Figure 9:
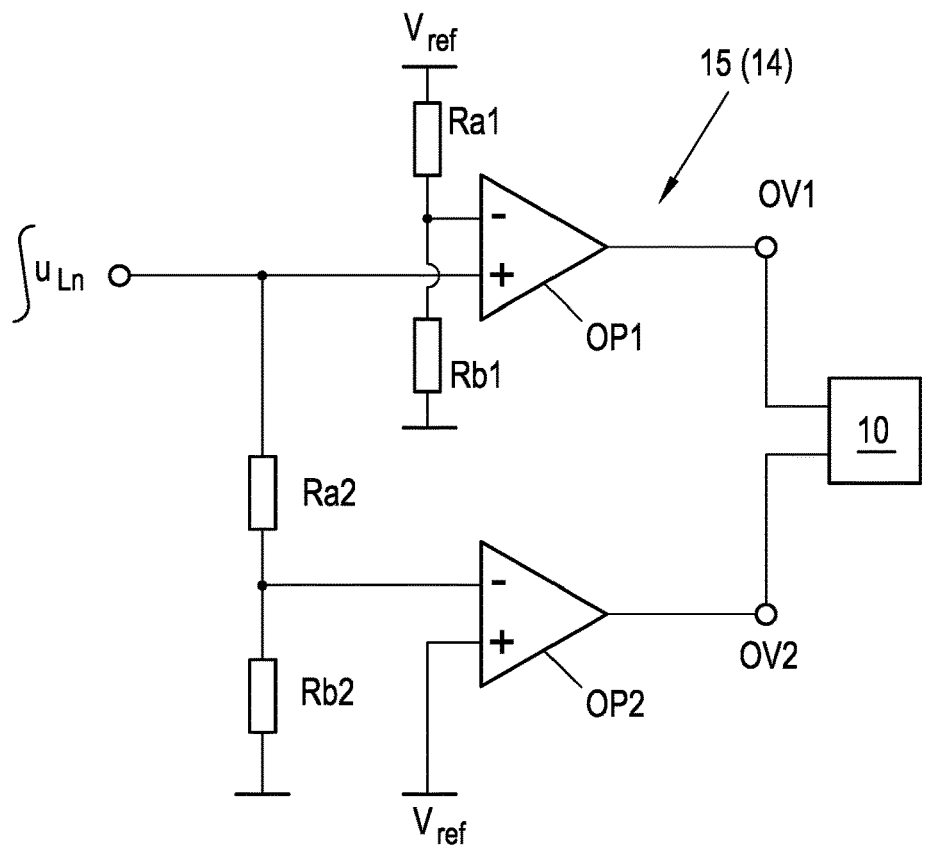
Figure 10:
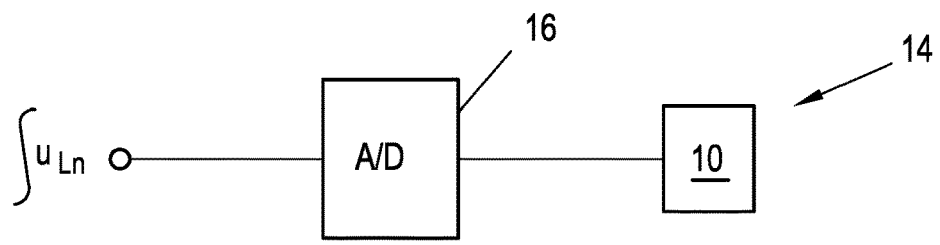

For overcurrent detection the processing unit 14 could be implemented as comparator circuit 15 as analog circuit using operational amplifiers OP as exemplarily shown in FIG. 9. The comparator circuit 15 is designed to output an output signal, when the leg current $i_{Ln}$ exceeds a given maximum current $\pm i_{Lnmax}$, that can be a positive and/or negative current. In the embodiment shown, the time integral $\int u_{Ln}$ signal obtained from the analog integrator 13 is supplied to a first input port, e.g. the positive input port, of a first operational amplifier OP1 of a first comparator of the comparator circuit 15. The second input port, e.g. the negative input port, of the first operational amplifier OP1 is supplied with the output voltage of a voltage divider using two resistors Ra1, Rb1 and a reference voltage $V_{Ref}$. The values of the resistors Ra1, Rb1 are chosen such that the output voltage OV1 of the first operational amplifier OP1 is at a high level when the leg current $i_{Lnn}$ exceeds a given maximum current $i_{Lmax}$. Usually the leg current $i_{Ln}$ can also become negative. Therefore, a second comparator using an operational amplifier OP2 and resistors Ra2, Rb2 may be provided in the comparator circuit 15 for detecting a negative maximum current $-i_{Lnmax}$. In this case the voltage divider formed by the resistors Ra2, Rb2, whose output is provided to a first input port, e.g. the negative input port, of the operational amplifiers OP2, is supplied with the time integral $\int u_{Ln}$ signal. The second input port, e.g. the positive input port, of the operational amplifier OP2 is supplied with a reference voltage $V_{Ref}$. The output voltage OV2 of the second operational amplifier OP2 of the comparator circuit 15 is preferably at a high level when the AC current $i_{Ln}$ exceeds a given negative maximum current $-i_{Lnmax}$.

The output of the comparator circuit 15 may be provided to and processed in the inverter controller 10. The inverter controller 10 could trigger a certain action if an overcurrent situation is detected. The inverter controller 10 could switch the inverter 1 into a safety mode or reduce the output current $i_{AC}$ in case of an over current.

The signal of the time integral $\int u_{Ln}$ obtained from the analog integrator 13 could also be digitised using an analog-to-digital converter 16 (A/D converter) and provided in digital form to the processing unit 14 (as in FIG. 10), e.g. the inverter controller 10, where the digital signal could be processed, e.g. for overcurrent protection of for controlling the switching stage 5 of the inverter 1. This could be used as continues current measurement of the leg current $i_{Ln}$. The A/D converter 16 could of course also be integrated in the inverter controller 10, e.g. as software and/or as hardware.

There are numerous designs of A/D converters 16 known and the invention is not limited to a specific A/D converter. The conversion rate of the A/D converter 16 used should however be fast enough in order to be able to capture the measured voltage $u_V$ or the leg current $i_{Ln}$ in its given frequency band.

The invention claimed is:

1. An inverter comprising:
    a switching stage with at least one switching leg comprising at least two serially connected semiconductor switches and an AC pole, which is between the serially connected semiconductor switches and serially connected to a choke;
    a current detection device, which is configured for detecting a leg current in the choke, comprises a voltage measurement unit that measures a voltage at the choke;
    an integrator configured to integrate the measured voltage at the choke over time, wherein a time integral of the voltage at the choke represents the leg current in the choke; and
    a processing unit for processing the time integral from the integrator,
    wherein the processed time integral is used in an inverter controller for controlling the inverter,
    wherein two integrator capacitors in series are arranged in the integrator, and
    wherein a reset switch is provided across each of the integrator capacitors for alternately resetting a corresponding integrator capacitor.

2. The inverter according to claim 1, wherein the voltage measurement unit is analogously implemented as a differential amplifier or instrumentation amplifier using at least one operational amplifier and resistors.

3. The inverter according to claim 1, wherein the integrator is analogously implemented as a serial RC circuit using two integrator capacitors serially connected to an integrator resistor or as an operational amplifier circuit using at least one operational amplifier with two serially connected integrator capacitors in a feedback branch connecting an output port of the operational amplifier to an input port of the operational amplifier.

4. The inverter according to claim 1, wherein the reset switches are implemented as switchover switches.

5. The inverter according to claim 4, the switchover switches are make-before-break switches.

6. The inverter according to claim 1, wherein alternately resetting the serially connected integrator capacitors is synchronized with zero crossings of the leg current.

7. The inverter according to claim 1, wherein the processing unit is analogously implemented as a comparator circuit, which is configured to provide an output signal when the leg current in the choke exceeds a given positive maximum current and/or when the leg current in the choke exceeds a given negative maximum current.

8. The inverter according to claim 1, wherein an analog-to-digital converter is configured for digitizing the time integral, and the digitized time integral is processed in the processing unit.

9. A method for operating an inverter having a switching stage with at least one switching leg with at least two serially connected semiconductor switches and an AC pole between the serially connected semiconductor switches, a choke to which the AC pole is serially connected, and in which a leg current is detected, the method comprising:
measuring a voltage at the choke; and
integrating the measured voltage over time to be representative for the leg current in the choke; and
processing a time integral of the voltage at the choke in a processing unit, and using the processed time integral in an inverter controller for controlling the inverter,
wherein the voltage at the choke is analogously integrated over time by two serially connected integrator capacitors,
wherein a reset switch is provided across each of the integrator capacitors for alternately resetting a corresponding integrator capacitor.

10. The method according to claim 9, wherein the voltage at the choke is analogously integrated over time by a serial RC circuit having two integrator capacitors serially connected to an integrator resistor or by an operational amplifier circuit having at least one operational amplifier with two serially connected integrator capacitors in a feedback branch connecting an output port of the operational amplifier to an input port of the operational amplifier.

11. The method according to claim 9, wherein the two serially connected integrator capacitors are alternately reset at zero crossings of the leg current.

12. The method according to claim 9, wherein the time integral is compared to a given positive maximum leg current and/or to a given negative maximum leg current for overcurrent protection.

13. The method according to claim 9, wherein the time integral is digitized and digitally provided to the processing unit for processing.

* * * * *